(12) United States Patent
Wei

(10) Patent No.: US 11,469,142 B2
(45) Date of Patent: Oct. 11, 2022

(54) DEVICE CHIP MANUFACTURING METHOD

(71) Applicant: DISCO CORPORATION, Tokyo (JP)

(72) Inventor: Frank Wei, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 98 days.

(21) Appl. No.: 16/857,483

(22) Filed: Apr. 24, 2020

(65) Prior Publication Data

US 2020/0343139 A1 Oct. 29, 2020

(30) Foreign Application Priority Data

Apr. 26, 2019 (JP) ............... JP2019-086232

(51) Int. Cl.
  *H01L 21/78* (2006.01)
  *B81C 1/00* (2006.01)
  *H01L 21/762* (2006.01)
  *H01L 21/02* (2006.01)

(52) U.S. Cl.
  CPC .......... *H01L 21/78* (2013.01); *B81C 1/00904* (2013.01); *H01L 21/02002* (2013.01); *H01L 21/76251* (2013.01)

(58) Field of Classification Search
  CPC ............... H01L 21/78; H01L 21/02002; H01L 21/76251; H01L 21/7806; H01L 29/66068; H01L 21/0445; H01L 21/3043; H01L 21/8213; B81C 1/00904; B81C 2201/0143; B81C 1/00888; B81C 1/00015; B81C 1/00865; B81C 2201/01; B23K 26/53; B23K 2103/50; B23K 26/55
  See application file for complete search history.

(56) References Cited

U.S. PATENT DOCUMENTS

2018/0138353 A1* 5/2018 Santos Rodriguez ..................... H01L 21/0201
2018/0218896 A1* 8/2018 Hirata ..................... C30B 33/00

FOREIGN PATENT DOCUMENTS

JP 200654483 A 2/2006

* cited by examiner

*Primary Examiner* — Thanh T Nguyen
(74) *Attorney, Agent, or Firm* — Greer Burns & Crain, Ltd.

(57) ABSTRACT

A device chip manufacturing method includes attaching a wafer to the first surface of a semiconductor ingot, separating the semiconductor ingot into a subject part and a remaining part after attachment, the subject part being attached to the wafer to form a laminated wafer having a front side as an exposed surface of the subject part and a back side as an exposed surface of the wafer, setting a plurality of crossing division lines on the front side of the laminated wafer to thereby define a plurality of separate regions after separation, and next forming a plurality of devices in the respective separate regions, and then dividing the laminated wafer along the division lines after forming the devices, thereby forming the plural device chips including the respective devices.

14 Claims, 17 Drawing Sheets

DEVICE CHIP MANUFACTURING METHOD

BACKGROUND OF THE INVENTION

Field of the Invention

The present invention relates to a device chip manufacturing method.

Description of the Related Art

In a semiconductor device chip fabrication process, the following manufacturing method is used. This manufacturing method includes the steps of slicing a silicon ingot to obtain a silicon wafer, next forming an insulating layer and a wiring layer on the silicon wafer to thereby form a plurality of devices on the silicon wafer, next thinning the silicon wafer thus having the devices, and finally dividing the silicon wafer to thereby obtain a plurality of semiconductor device chips (see JP-A-2006-54483, for example).

SUMMARY OF THE INVENTION

In such a device chip manufacturing method, there is a case that the silicon wafer is replaced of an SiC (silicon carbide) wafer, and the devices are formed on the SiC wafer. In this case, it is possible to form a power device having high energy efficiency with low conduction loss and low switching loss or to form a high-sensitivity sensor using a cantilever having a high resonant frequency. However, since the SiC wafer is hard, it is difficult to thin the SiC wafer and much time is required for the thinning of the SiC wafer.

In addition, when the SiC wafer is thinned, a thinned part of the SiC wafer is discarded. Accordingly, in the case of manufacturing device chips from the SiC wafer that is expensive, a manufacturing cost for the device chips may be increased.

It is therefore an object of the present invention to provide a device chip manufacturing method which can suppress an increase in manufacturing cost for the device chips.

In accordance with an aspect of the present invention, there is provided a device chip manufacturing method for manufacturing a plurality of device chips from a semiconductor ingot having a first surface and a second surface opposite to the first surface, the device chip manufacturing method including: an attaching step of attaching a wafer to the first surface of the semiconductor ingot; a separating step of separating the semiconductor ingot into a subject part and a remaining part after performing the attaching step, the subject part being attached to the wafer to form a laminated wafer having a front side as an exposed surface of the subject part and a back side as an exposed surface of the wafer; a device forming step of setting a plurality of crossing division lines on the front side of the laminated wafer to thereby define a plurality of separate regions after performing the separating step, and next forming a plurality of devices in the respective separate regions; and a dividing step of dividing the laminated wafer along the division lines after performing the device forming step, thereby forming the plurality of device chips including the respective devices.

Preferably, the separating step includes a first step of setting a focal point of a laser beam having a transmission wavelength to the semiconductor ingot inside the semiconductor ingot at a predetermined depth from the second surface of the semiconductor ingot and next applying the laser beam to the second surface of the semiconductor ingot to thereby form a separation layer inside the semiconductor ingot at the predetermined depth, and a second step of applying an external force to the separation layer to thereby separate the semiconductor ingot into the subject part and the remaining part.

Preferably, the device chip manufacturing method further includes: a laser beam applying step of setting a focal point of a laser beam having a transmission wavelength to the semiconductor ingot inside the semiconductor ingot at a predetermined depth from the first surface of the semiconductor ingot before performing the attaching step, and next applying the laser beam to the first surface of the semiconductor ingot to thereby form a separation layer inside the semiconductor ingot at the predetermined depth; the separating step including a step of applying an external force to the separation layer to thereby separate the semiconductor ingot into the subject part and the remaining part.

Preferably, the device chip manufacturing method further includes: a second attaching step of attaching a second wafer to the remaining part of the semiconductor ingot after performing the separating step; and a second separating step of separating the remaining part of the semiconductor ingot into a second subject part and a new remaining part after performing the second attaching step, the second subject part being attached to the second wafer to form a second laminated wafer.

Preferably, the semiconductor ingot includes an SiC ingot. Preferably, the attaching step includes a step of bonding the wafer through an insulating layer to the semiconductor ingot. Preferably, each of the devices includes a MOSFET or a MEMS device.

The device chip manufacturing method of the present invention can exhibit an effect that an increase in manufacturing cost for the device chips can be suppressed.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENTS

Preferred embodiments of the present invention will now be described in detail with reference to the drawings. The present invention is not limited to the preferred embodiments. Further, the components used in the preferred embodiments may include those that can be easily assumed by persons skilled in the art or substantially the same elements as those known in the art. Further, the configurations described below may be suitably combined. Further, the configurations may be variously omitted, replaced, or changed without departing from the scope of the present invention.

First Preferred Embodiment

Figure 1:
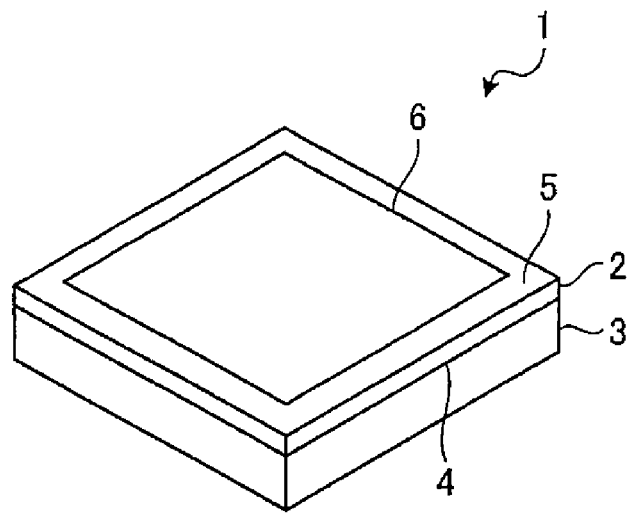
FIG. 1 is a perspective view of a device chip manufactured by a device chip manufacturing method according to a first preferred embodiment of the present invention.
Figure 2:
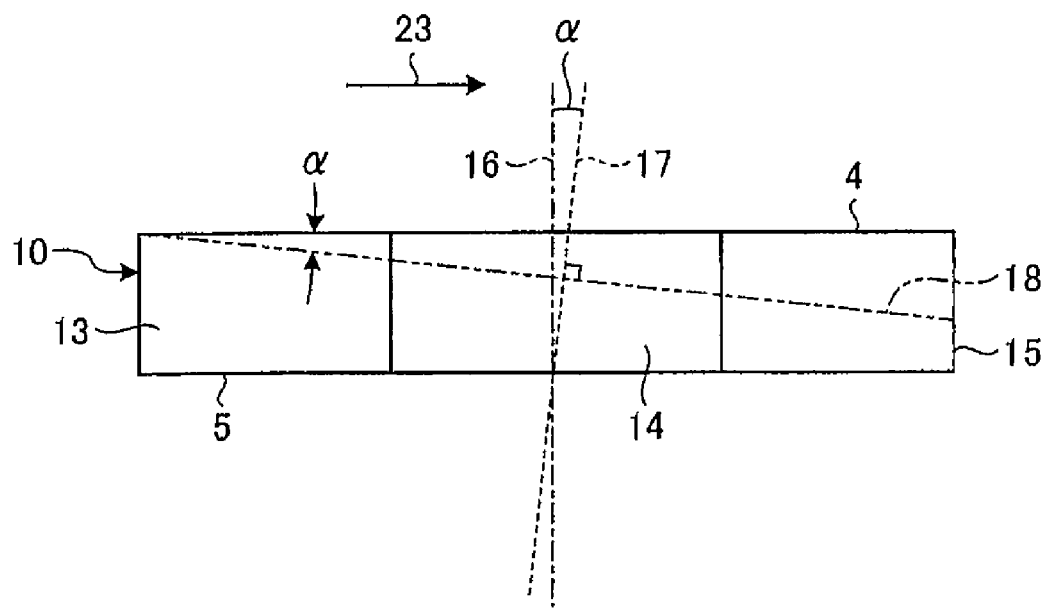
FIG. 2 is a side view of an SiC ingot as a workpiece to be processed in the device chip manufacturing method according to the first preferred embodiment.
Figure 3:
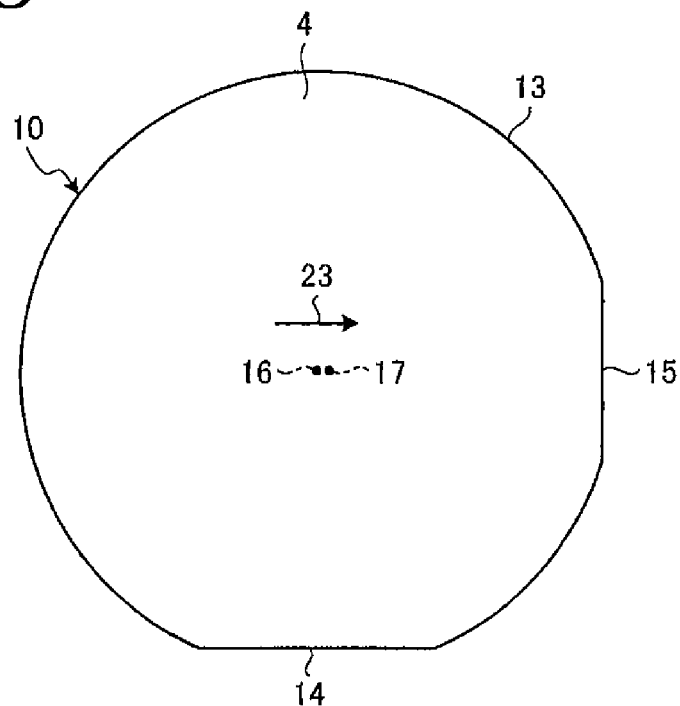
FIG. 3 is a plan view of the SiC ingot illustrated in FIG. 2.
Figure 4:
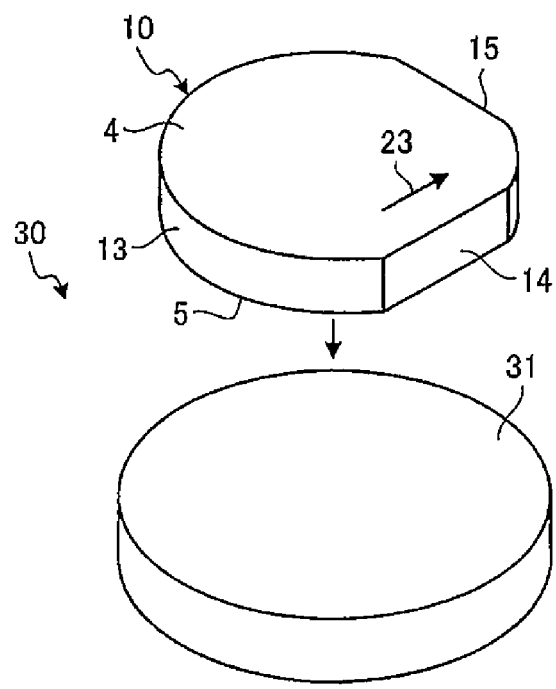
FIG. 4 is a perspective view illustrating a manner of holding the SiC ingot illustrated in FIG. 2 on a chuck table included in a grinding apparatus under suction.
Figure 5:
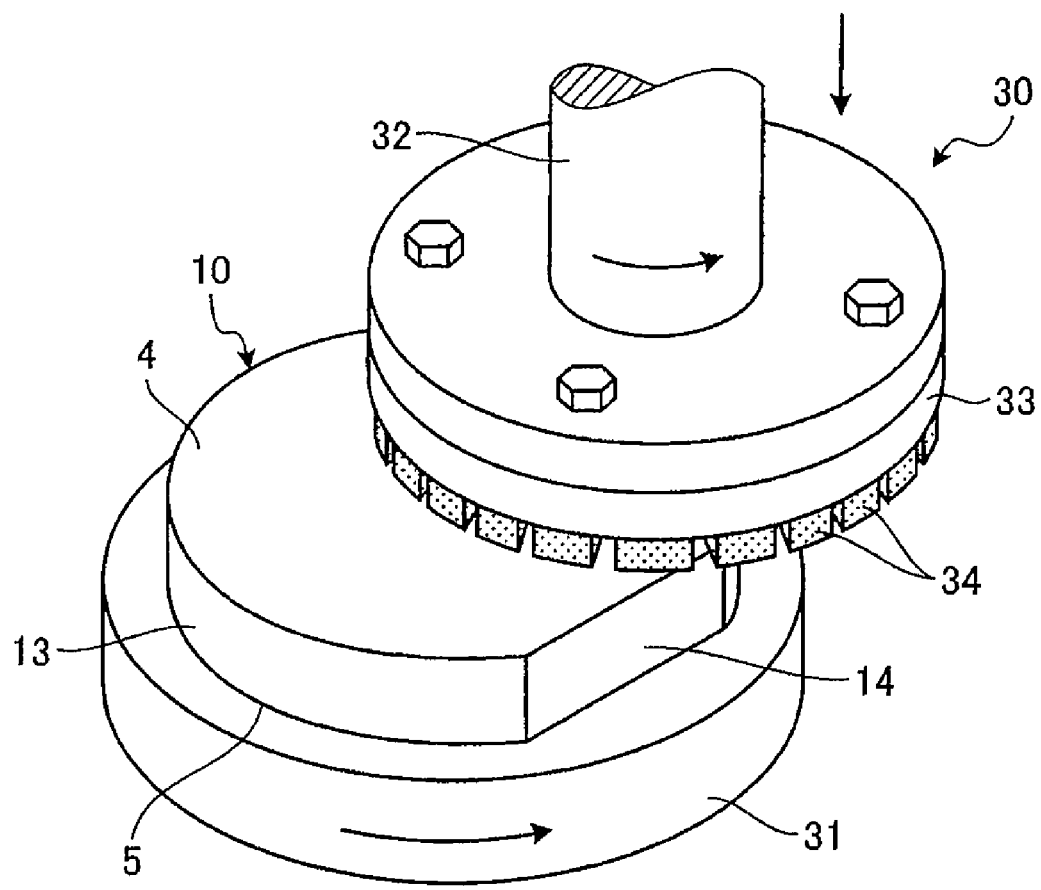
FIG. 5 is a perspective view illustrating a manner of flattening a first surface of the SiC ingot illustrated in FIG. 2 by using the grinding apparatus.
Figure 6:
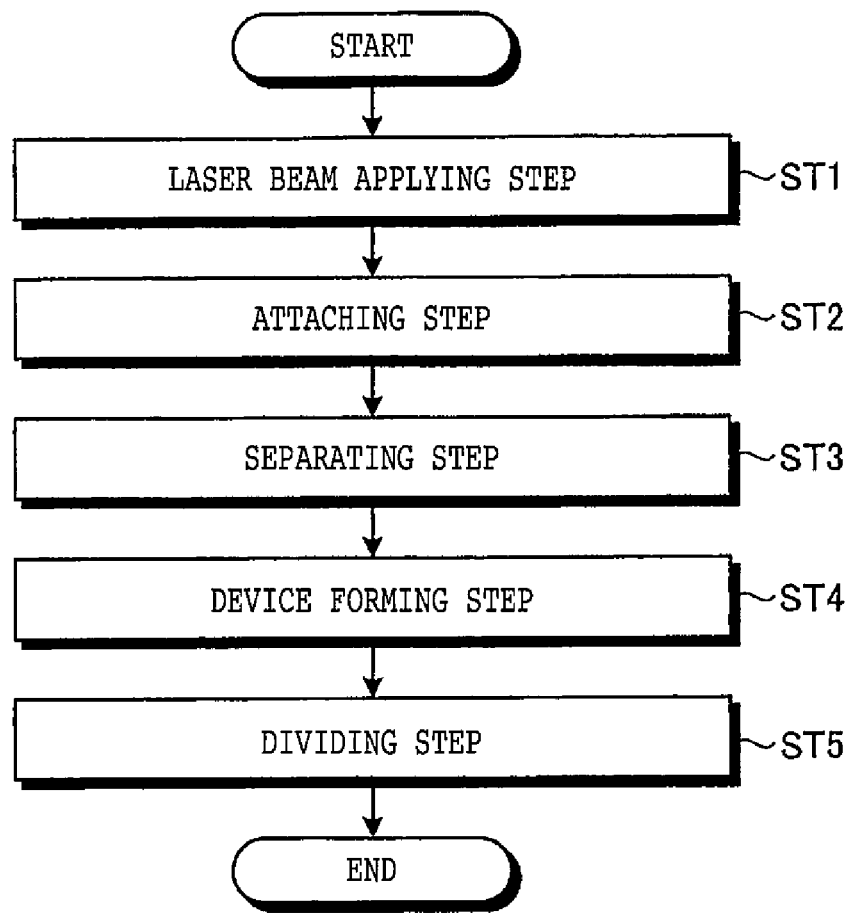
FIG. 6 is a flowchart illustrating the flow of the device chip manufacturing method according to the first preferred embodiment.

A device chip manufacturing method according to a first preferred embodiment of the present invention will now be described with reference to the drawings. FIG. 1 is a perspective view of a device chip 1 manufactured by the device chip manufacturing method according to the first preferred embodiment. FIG. 2 is a side view of an SiC ingot 10 as a workpiece to be processed in the device chip manufacturing method according to the first preferred embodiment. FIG. 3 is a plan view of the SiC ingot 10 illustrated in FIG. 2. FIG. 4 is a perspective view illustrating a manner of holding the SiC ingot 10 illustrated in FIG. 2 on a chuck table 31 included in a grinding apparatus 30 under suction. FIG. 5 is a perspective view illustrating a manner of flattening a first surface 4 of the SiC ingot 10 illustrated in FIG. 2 by using the grinding apparatus 30. FIG. 6 is a flowchart illustrating the flow of the device chip manufacturing method according to the first preferred embodiment.

The device chip manufacturing method according to the first preferred embodiment is a method of manufacturing the device chip 1 illustrated in FIG. 1. As illustrated in FIG. 1, the device chip 1 includes an SiC layer 2 having a first surface 4 and a second surface 5 opposite to the first surface 4, a silicon substrate 3 attached to the first surface 4 of the SiC layer 2, and a device 6 formed on the second surface 5 of the SiC layer 2. In the case that the device 6 is a MEMS (Micro Electro Mechanical Systems) device, the SiC layer 2 has a thickness of 40 to 80 μm. In the case that the device 6 is a MOSFET (Metal Oxide Semiconductor Field Effect Transistor) or another power device, the SiC layer 2 has a thickness of 80 to 100 μm.

In the first preferred embodiment, the SiC layer 2 is formed of SiC (silicon carbide). However, the SiC layer 2 may be replaced by a semiconductor layer formed of any semiconductors other than SiC. Further, in the first preferred embodiment, the silicon substrate 3 is formed of silicon. However, the silicon substrate 3 may be replaced by a substrate formed of any materials other than silicon. Further, in the first preferred embodiment, the SiC layer 2 and the silicon substrate 3 are bonded to each other by diffusion bonding or plasma-assisted low-temperature bonding. However, the SiC layer 2 and the silicon substrate 3 may be attached to each other by any methods other than diffusion bonding and plasma-assisted low-temperature bonding.

Further, in the first preferred embodiment, the device 6 is a MOSFET or a MEMS device. However, the device 6 is not limited to a MOSFET and a MEMS device.

The device chip 1 illustrated in FIG. 1 is manufactured by the following manner. The first surface 4 of the SiC ingot 10 illustrated in FIGS. 2 and 3 is first flattened. Thereafter, a wafer 20 (see FIG. 9) forming the silicon substrate 3 is attached to the first surface 4 of the SiC ingot 10. Thereafter, a subject part 11 (see FIG. 11) attached to the wafer 20 is separated from the SiC ingot 10, in which the subject part 11 forms the SiC layer 2. Thereafter, a plurality of devices 6 (see FIG. 13) are formed on a front side 12 of the subject part 11 attached to the wafer 20. Thereafter, the subject part 11 attached to the wafer 20 is divided into individual device chips 1 including the respective devices 6.

As illustrated in FIGS. 2 and 3, the SiC ingot 10 has a substantially cylindrical shape. In the following description of the SiC ingot 10, parts common to those of the device chip 1 illustrated in FIG. 1 are denoted by the same reference numerals.

The SiC ingot 10 has a substantially circular first surface 4, a substantially circular second surface 5 opposite to the first surface 4, and a substantially cylindrical surface 13 formed so as to connect the first surface 4 and the second surface 5. Further, the cylindrical surface 13 is formed with a first orientation flat 14 and a second orientation flat 15 perpendicular to the first orientation flat 14 as illustrated in FIG. 3. The first orientation flat 14 is longer than the second orientation flat 15 as illustrated in FIG. 3.

The SiC ingot 10 has a c-axis 17 extending from the first surface 4 to the second surface 5 and a c-plane 18 perpendicular to the c-axis 17. The c-axis 17 is inclined by an off angle α with respect to a normal 16 to the first surface 4. The direction of inclination of the c-axis 17 is illustrated by reference numeral 23 in FIGS. 2 and 3. The direction 23 of inclination of the c-axis 17 is pointed to the second orientation flat 15. The c-plane 18 is inclined by this off angle α with respect to the first surface 4. That is, the off angle α is formed between the c-plane 18 and the first surface 4. The direction 23 of inclination of the c-axis 17 is perpendicular to the direction of extension of the second orientation flat 15 and parallel to the direction of extension of the first orientation flat 14. The c-plane 18 includes numerous elements at a molecular level as set in the SiC ingot 10. In the first preferred embodiment, the off angle α is set to 1, 3, or 6 degrees. However, the off angle α may be freely set in the range of 1 to 6 degrees in the present invention.

The first surface 4 of the SiC ingot 10 is ground by using a grinding apparatus 30 illustrated in FIGS. 4 and 5. The grinding apparatus 30 includes a chuck table 31 for holding the SiC ingot 10 and a grinding wheel 33 fixed to a lower end of a spindle 32. The grinding wheel 33 has a plurality of abrasive members 34 for grinding the first surface 4 of the SiC ingot 10. The chuck table 31 is rotatable about its vertical axis, and the spindle 32 is also rotatable about its vertical axis. As illustrated in FIGS. 4 and 5, the SiC ingot 10 is held on the chuck table 31 under suction in the condition where the second surface 5 of the SiC ingot 10 is in contact with an upper surface of the chuck table 31. That is, the first surface 4 of the SiC ingot 10 is oriented upward. In this condition, the chuck table 31 is rotated and the spindle 32 is also rotated to thereby rotate the grinding wheel 33. Thereafter, the grinding wheel 33 is lowered until the abrasive members 34 come into contact with the first surface 4 of the SiC ingot 10. Thereafter, the grinding wheel 33 is further lowered at a predetermined feed speed to thereby grind the first surface 4 of the SiC ingot 10. Further, the first surface 4 of the SiC ingot 10 is next polished by using a polishing apparatus (not illustrated). The polishing apparatus includes a spindle rotatable about its vertical axis and a polishing wheel fixed to a lower end of this spindle. The polishing wheel has a polishing pad for polishing the first surface 4 of the SiC ingot 10. After grinding the first surface 4 of the SiC ingot 10 by using the grinding apparatus 30 as mentioned above, the chuck table 31 holding the SiC ingot 10 is positioned below the polishing wheel. Thereafter, the chuck table 31 is rotated and the spindle of the polishing apparatus is also rotated to rotate the polishing wheel. Thereafter, the polishing wheel is lowered until the polishing pad comes into contact with the first surface 4 of the SiC ingot 10. Accordingly, the first surface 4 of the SiC ingot 10 is polished by the polishing pad to become a mirror surface.

In the first preferred embodiment, the wafer 20 is a disk-shaped member formed of silicon as a base material. The wafer 20 has a diameter equal to a diameter of the SiC ingot 10. The wafer 20 has a thickness capable of supporting the subject part 11 separated from the SiC ingot 10 and suppressing damage to the subject part 11. For example, the thickness of the wafer 20 is preferably set to 100 to 1000 μm. In the following description of the wafer 20, parts common to those of the device chip 1 illustrated in FIG. 1 are denoted by the same reference numerals.

As illustrated in FIG. 6, the device chip manufacturing method according to the first preferred embodiment includes a laser beam applying step ST1, an attaching step ST2, a separating step ST3, a device forming step ST4, and a dividing step ST5.

(Laser Beam Applying Step)

Figure 7:
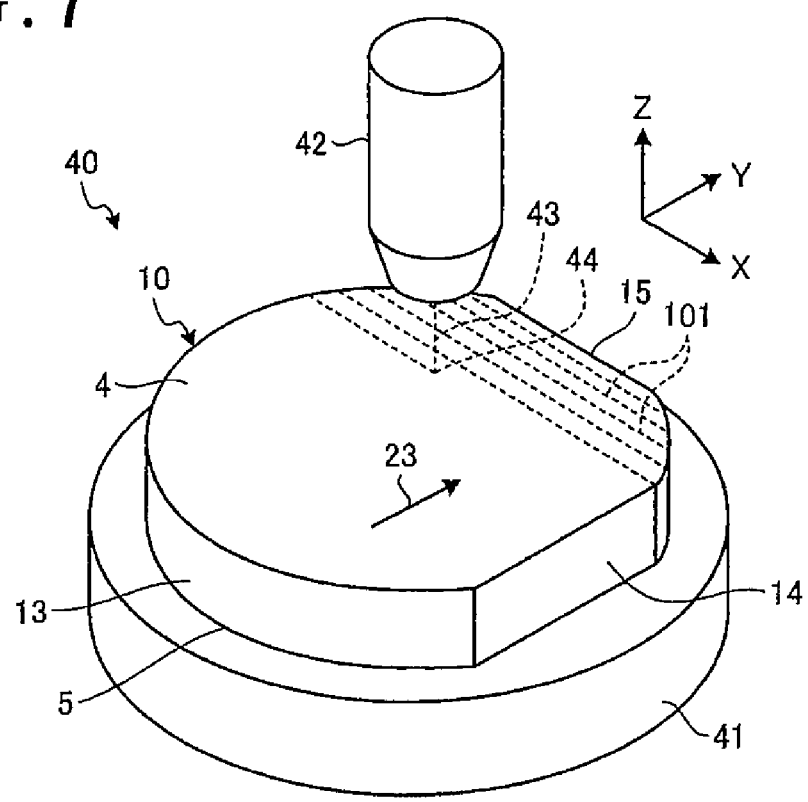
FIG. 7 is a perspective view illustrating a laser beam applying step in the device chip manufacturing method illustrated in FIG. 6.
Figure 8:
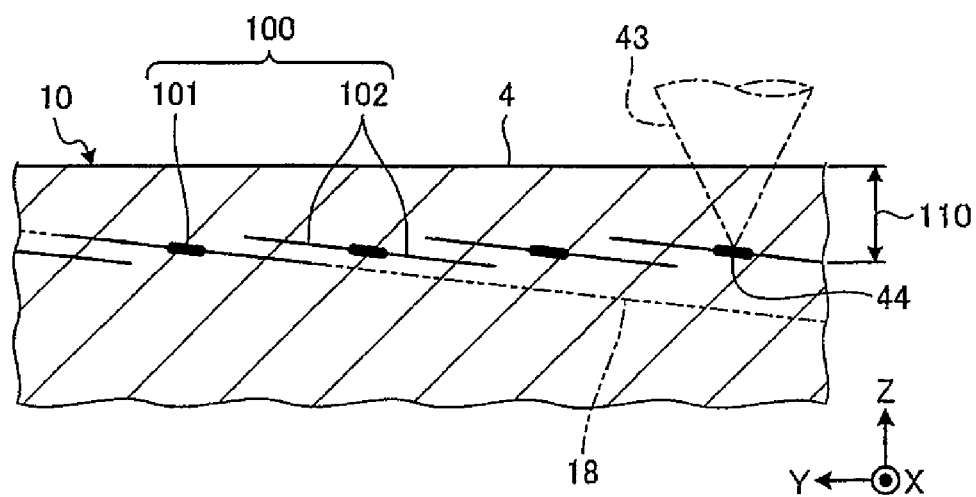
FIG. 8 is a sectional view of an essential part of the SiC ingot processed by the laser beam applying step.

FIG. 7 is a perspective view illustrating the laser beam applying step ST1 of the device chip manufacturing method illustrated in FIG. 6. FIG. 8 is a sectional view of an essential part of the SiC ingot 10 processed by the laser beam applying step ST1 of the device chip manufacturing method illustrated in FIG. 6. As illustrated in FIGS. 7 and 8, the laser beam applying step ST1 is a step of setting a focal point 44 of a laser beam 43 having a transmission wavelength to the SiC ingot 10 inside the SiC ingot 10 before performing the attaching step ST2, and next applying the laser beam 43 to the SiC ingot 10 to thereby form a separation layer 100 inside the SiC ingot 10.

The laser beam applying step ST1 is performed by using a laser processing apparatus 40 illustrated in FIG. 7. The laser processing apparatus 40 includes a chuck table 41 for holding the SiC ingot 10, imaging means (not illustrated) for imaging the SiC ingot 10 held on the chuck table 41, and a laser beam applying unit 42 for applying the laser beam 43 to the SiC ingot 10 held on the chuck table 41. In performing the laser beam applying step ST1, the SiC ingot 10 is held on the chuck table 41 in the condition where the second surface 5 of the SiC ingot 10 is in contact with an upper surface of the chuck table 41. That is, the first surface 4 of the SiC ingot 10 held on the chuck table 41 is oriented upward. Thereafter, the imaging means is operated to image the SiC ingot 10 held on the chuck table 41. According to an image obtained by the imaging means, the chuck table 41 is suitably rotated and moved to adjust the orientation of the SiC ingot 10 to a predetermined orientation and also to adjust a relative positional relation between the laser beam applying unit 42 and the SiC ingot 10 in a horizontal direction. More specifically, the second orientation flat 15 of the SiC ingot 10 is made parallel to an X direction illustrated by an arrow X, and the direction 23 of inclination of the c-axis 17 is made parallel to a Y direction illustrated by an arrow Y. That is, the first orientation flat 14 of the SiC ingot 10 is made parallel to the Y direction. The X direction is perpendicular to the Y direction in a horizontal plane.

After adjusting the position of the SiC ingot 10, the focal point 44 of the laser beam 43 to be applied from the laser beam applying unit 42 is set inside the SiC ingot 10 at a predetermined depth 110 from the first surface 4 of the SiC ingot 10. The predetermined depth 110 is preferably equal to a depth corresponding to the thickness of the SiC layer 2, this thickness being set as a thickness indispensable for the formation of the device 6 on the first surface 4 of the device chip 1 illustrated in FIG. 1. For example, the predetermined depth 110 is preferably set to 30 to 100 μm.

After setting the focal point 44 of the laser beam 43 inside the SiC ingot 10 as mentioned above, the chuck table 41 and the laser beam applying unit 42 are relatively moved in the X direction at a predetermined feed speed and at the same time the pulsed laser beam 43 having a transmission wavelength to the SiC ingot 10 is applied to the first surface 4 of the SiC ingot 10 as illustrated in FIG. 7. As illustrated in FIG. 8, by the first application of the pulsed laser beam 43 to the SiC ingot 10, SiC is decomposed into Si (silicon) and C (carbon). By the next application of the pulsed laser beam 43 to the SiC ingot 10, the laser beam 43 is absorbed by C (carbon) previously produced. Then, SiC is decomposed into Si and C in a chain reaction manner to form a modified portion 101. At the same time, cracks 102 are also formed so as to extend isotropically from the modified portion 101 along the c-plane 18.

In this manner, the laser beam 43 is applied to the SiC ingot 10 along a line from one end to the other end thereof, thereby forming the separation layer 100 inside the SiC ingot 10 along this line, the separation layer 100 including the modified portion 101 and the cracks 102. Thereafter, the chuck table 41 and the laser beam applying unit 42 are relatively moved in the Y direction by a predetermined index amount. This predetermined index amount is set so as not to exceed the diameter of a circular area defined by the cracks 102 extending isotropically. In this manner, a laser processing operation is performed by applying the laser beam 43 to the SiC ingot 10 as relatively moving the chuck table 41 and the laser beam applying unit 42 in the X direction. Further, an indexing operation is performed by relatively moving the chuck table 41 and the laser beam applying unit 42 in the Y direction. Thereafter, the laser processing operation and the indexing operation are repeated to form a plurality of modified portions 101 linearly arranged in the X direction and spaced the predetermined index amount in the Y direction and also form a plurality of cracks 102 extending isotropically from each modified portion 101.

Thus, the separation layer 100 is formed inside the SiC ingot 10 at the predetermined depth 110 from the first surface 4 of the SiC ingot 10, the separation layer 100 including the plural modified portions 101 and the plural cracks 102. In each modified portion 101, SiC has been decomposed into Si and C. Accordingly, the separation layer 100 has a reduced mechanical strength, so that the SiC ingot 10 can be easily separated along the separation layer 100. After finishing the laser beam applying step ST1 to form the separation layer 100 inside the SiC ingot 10 at the predetermined depth 110 as mentioned above, the device chip manufacturing method proceeds to the attaching step ST2. While the SiC ingot 10 is held on the chuck table 41 of the laser processing apparatus 40 in the laser beam applying step ST1 in the first preferred embodiment, the chuck table 31 of the grinding apparatus 30 may be moved to a position below the laser beam applying unit 42 in the condition where the SiC ingot 10 is held on the chuck table 31, and the laser beam 43 may be applied to the SiC ingot 10 held on the chuck table 31 of the grinding apparatus 30.

(Attaching Step)

Figure 9:
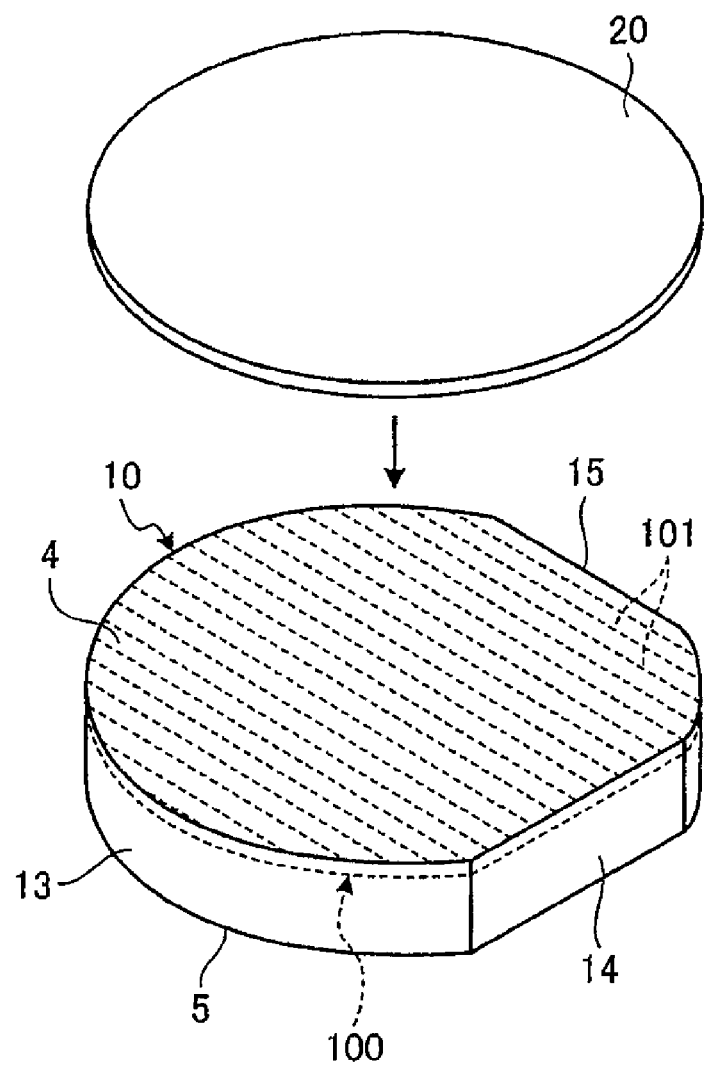
FIG. 9 is a perspective view illustrating an attaching step in the device chip manufacturing method illustrated in FIG. 6.

FIG. 9 is a perspective view illustrating the attaching step ST2 of the device chip manufacturing method illustrated in FIG. 6. The attaching step ST2 is a step of attaching a wafer 20 to the first surface 4 of the SiC ingot 10. In the first preferred embodiment, the attaching step ST2 is performed by placing the wafer 20 on the first surface 4 of the SiC ingot 10 and next performing diffusion bonding or plasma-assisted low-temperature bonding to bond the wafer 20 to the first surface 4 of the SiC ingot 10. As a modification, the wafer 20 may be attached to the first surface 4 of the SiC ingot 10 by any methods other than diffusion bonding and plasma-assisted low-temperature bonding. After finishing the attaching step ST2 to attach the wafer 20 to the first surface 4 of the SiC ingot 10, the device chip manufacturing method proceeds to the separating step ST3.

(Separating Step)

Figure 10:
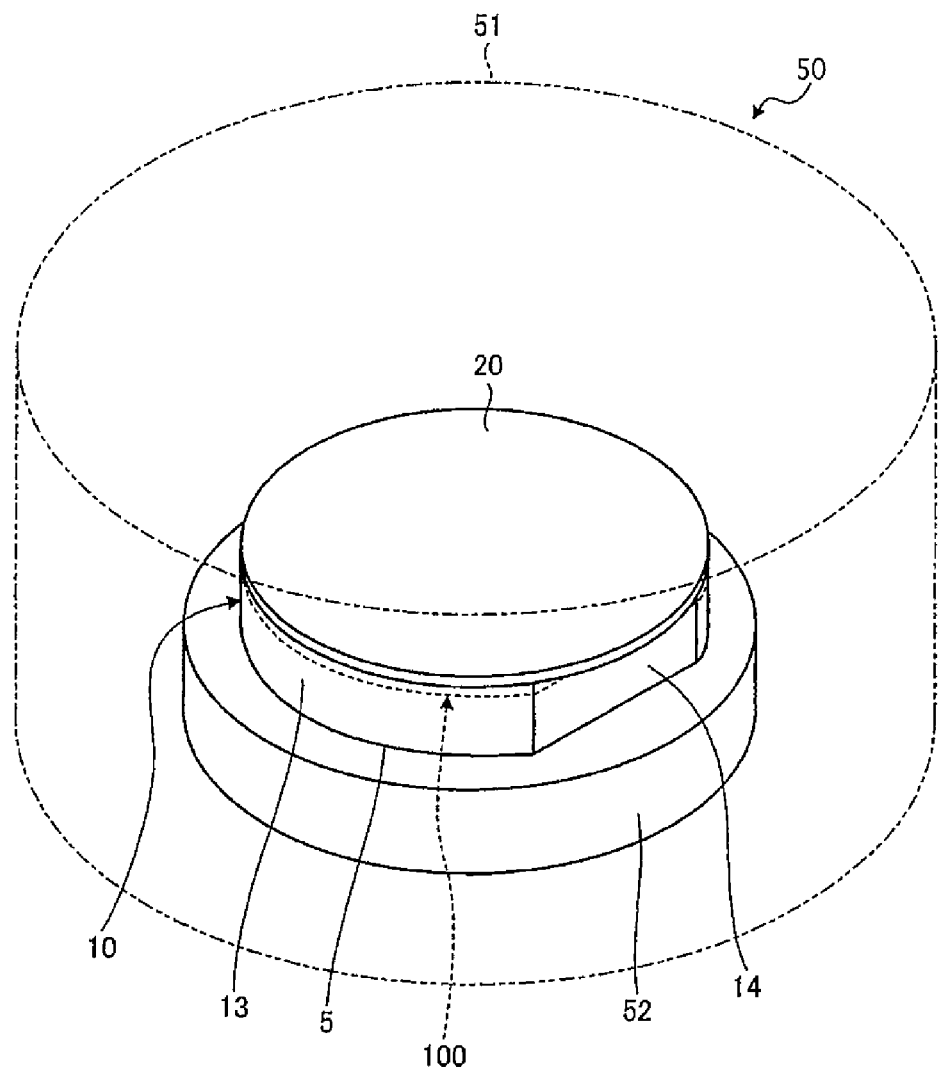
FIG. 10 is a perspective view illustrating a manner of separating a subject part from the SiC ingot in a separating step in the device chip manufacturing method illustrated in FIG. 6.
Figure 11:
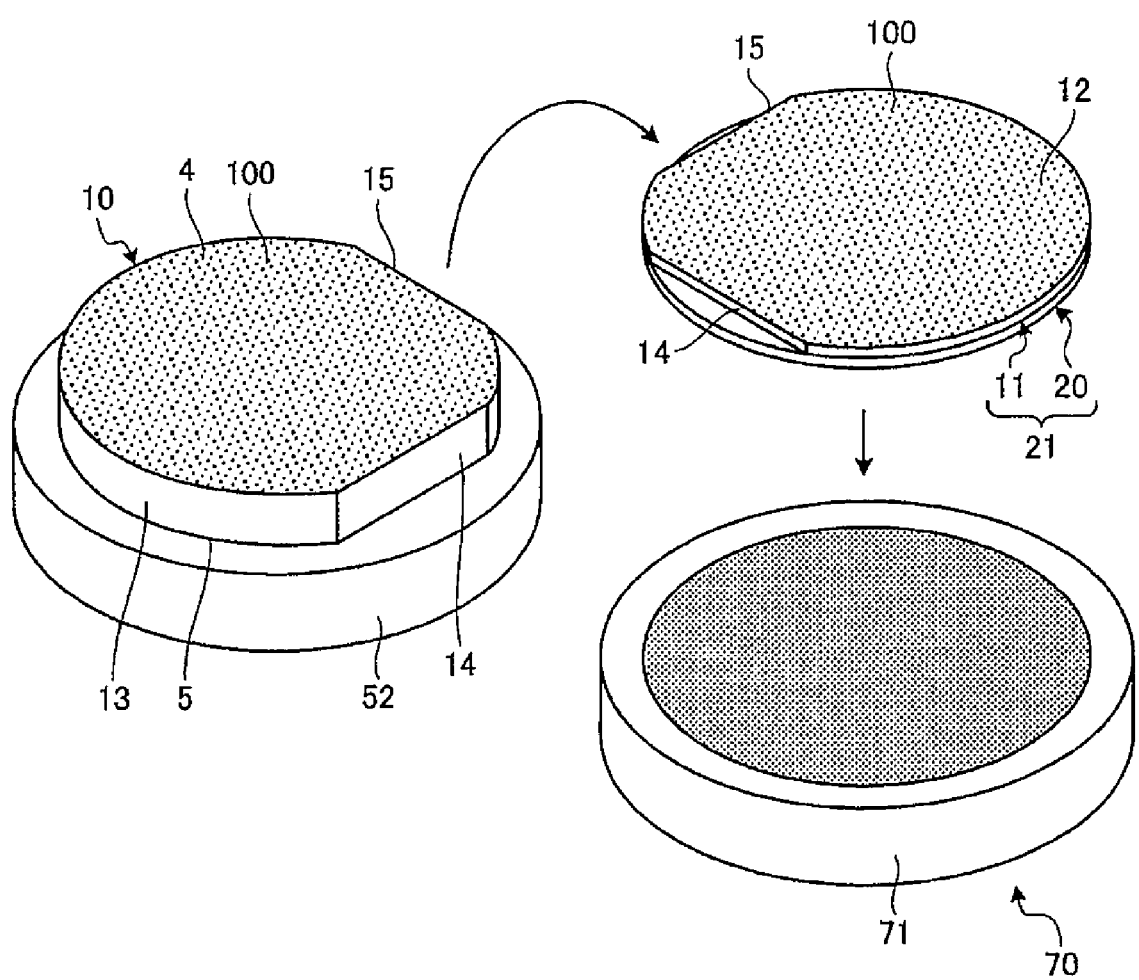
FIG. 11 is a perspective view illustrating a manner of holding the subject part on a chuck table included in a grinding apparatus in the separating step.
Figure 12:
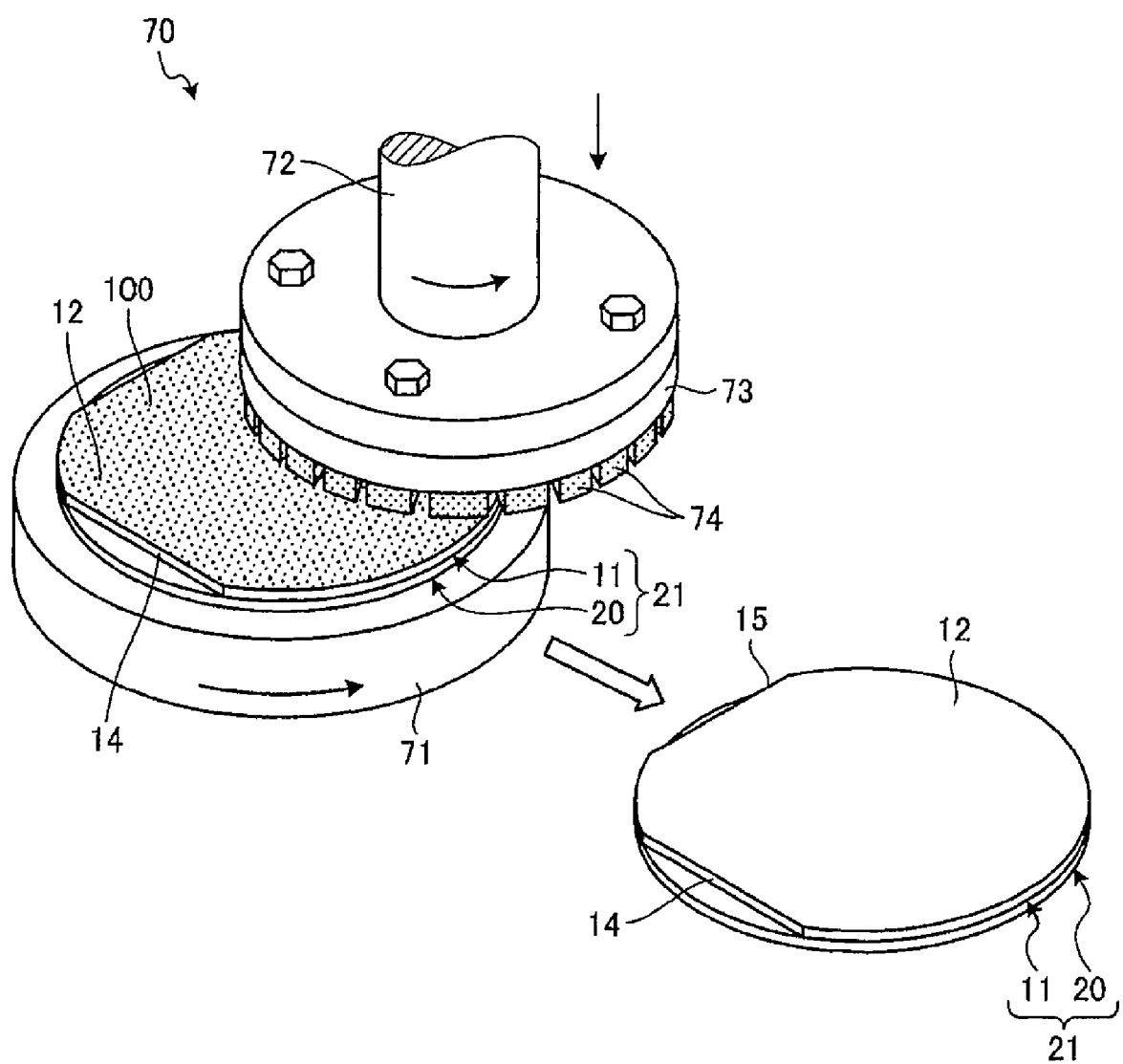
FIG. 12 is a perspective view illustrating a manner of grinding the front side of the subject part by using the grinding apparatus in the separating step.

FIG. 10 is a perspective view illustrating a manner of separating a subject part 11 from the SiC ingot 10 in the separating step ST3 of the device chip manufacturing method illustrated in FIG. 6. FIG. 11 is a perspective view illustrating a manner of holding the subject part 11 on a chuck table 71 included in a grinding apparatus 70 in the separating step ST3. FIG. 12 is a perspective view illustrating a manner of grinding the front side 12 of the subject part 11 by using the grinding apparatus 80 in the separating step ST3.

The separating step ST3 is a step of separating the SiC ingot 10 into the subject part 11 (see FIG. 11) and a remaining part of the SiC ingot 10, in which the subject part 11 is attached to the wafer 20 to form a laminated wafer 21. In performing the separating step ST3, a water bath 50 having a cylindrical housing 51 is prepared as illustrated in FIG. 10. A holding table 52 is provided in the housing 51 of the water bath 50 so as to be vertically movable. The SiC ingot 10 with the wafer 20 is placed on the holding table 52 in the condition where the second surface 5 of the SiC ingot 10 is in contact with an upper surface of the holding table 52. Thereafter, the holding table 52 is lowered to set the SiC ingot 10 with the wafer 20 in the water bath 50.

Thereafter, water is supplied into the water bath 50 until the SiC ingot 10 with the wafer 20 is immersed in the water (until the level of the surface of the water in the water bath 50 becomes higher than the level of the upper surface of the wafer 20 attached to the SiC ingot 10 held on the holding table 52). Thereafter, an ultrasonic vibrator (not illustrated) formed from piezoelectric ceramic or the like is operated in the water stored in the water bath 50, so as to generate ultrasonic vibration. In operating the ultrasonic vibrator, the ultrasonic vibrator may be brought into contact with the SiC ingot 10. Alternatively, a spacing (e.g., 2 to 3 mm) may be defined between the ultrasonic vibrator and the SiC ingot 10.

When the ultrasonic vibrator is operated to generate ultrasonic vibration, the separation layer 100 formed in the SiC ingot 10 is stimulated to be broken by the ultrasonic vibration. Accordingly, the SiC ingot 10 is separated along the separation layer 100 to obtain the subject part 11 with the wafer 20 as illustrated in FIG. 11. The subject part 11 with the water 20 attached thereto forms the laminated wafer 21. As a modification, the separation of the subject part 11 from the SiC ingot 10 may be performed by using a tool such as a chisel having a tapering tip or by mechanical separation, whereby an impact can be applied to the separation layer 100. As illustrated in FIG. 11, the SiC ingot 10 is separated along the separation layer 100 to obtain the laminated wafer 21 and the remaining part of the SiC ingot 10, the laminated wafer 21 including the subject part 11 and the wafer 20 attached to each other. In the condition illustrated in FIG. 11, a part of the separation layer 100 is left on the front side 12 of the subject part 11 of the laminated wafer 21, and a remaining part of the separation layer 100 is also left on the first surface 4 (newly exposed surface) of the remaining part of the SiC ingot 10.

After separating the laminated wafer 21 from the SiC ingot 10 as mentioned above, the front side 12 of the subject part 11 of the laminated wafer 21 is ground by using a grinding apparatus 70 illustrated in FIG. 12, thereby removing the separation layer 100 left on the front side 12. The grinding apparatus 70 includes a chuck table 71 for holding the laminated wafer 21 and a grinding wheel 73 fixed to a lower end of a spindle 72. The grinding wheel 73 has a plurality of abrasive members 74 for grinding the front side 12 of the subject part 11. The chuck table 71 is rotatable about its vertical axis, and the spindle 72 is also rotatable about its vertical axis. As illustrated in FIG. 12, the laminated wafer 21 is held on the chuck table 71 under suction in the condition where the wafer 20 of the laminated wafer 21 is in contact with an upper surface of the chuck table 71. That is, the front side 12 of the subject part 11 of the laminated wafer 21 held on the chuck table 71 is oriented upward. In this condition, the chuck table 71 is rotated and the spindle 72 is also rotated to thereby rotate the grinding wheel 73. Thereafter, the grinding wheel 73 is lowered until the abrasive members 74 come into contact with the front side 12 of the subjected part 11. Thereafter, the grinding wheel 73 is further lowered at a predetermined feed speed to thereby grind the front side 12 of the subject part 11. Thus, the front side 12 is flattened to remove roughness. Thereafter, the front side 12 may be polished to become a mirror surface. After finishing the separating step ST3 to flatten the front side 12 of the subject part 11 as mentioned above, the device chip manufacturing method proceeds to the device forming step ST4.

(Device Forming Step)

Figure 13:
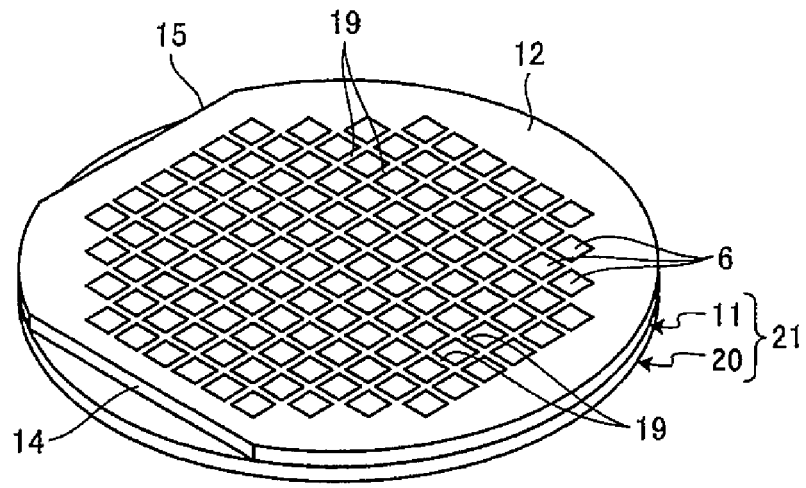
FIG. 13 is a perspective view illustrating a device forming step in the device chip manufacturing method illustrated in FIG. 6.

FIG. 13 is a perspective view of the laminated wafer 21 processed by the device forming step ST4 of the device chip manufacturing method illustrated in FIG. 6. The device forming step ST4 is a step of setting a plurality of crossing division lines 19 on the front side 12 of the subject part 11 of the laminated wafer 21 to thereby define a plurality of separate regions and then forming a plurality of devices 6 in the respective separate regions. In this manner, the front side 12 of the subject part 11 of the laminated wafer 21 is partitioned by the crossing division lines 19 to define the separate regions, and the devices 6 are formed in the respective separate regions. After performing the device forming step ST4, the device chip manufacturing method proceeds to the dividing step ST5.

(Dividing Step)

Figure 14:
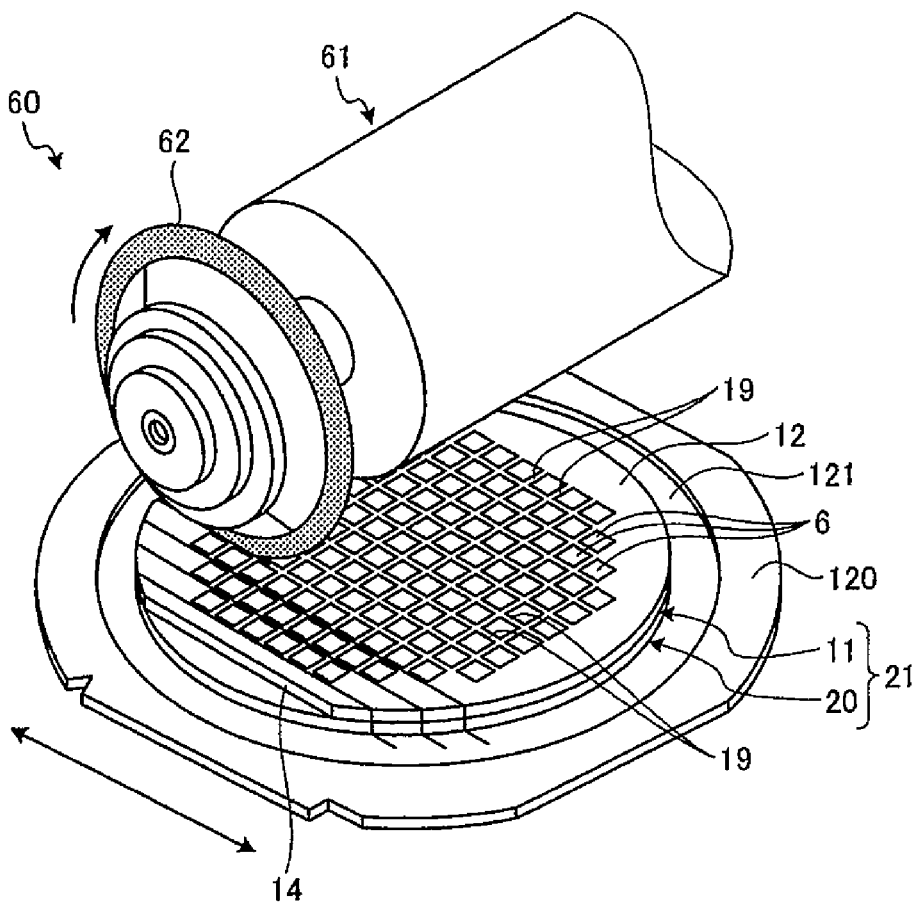
FIG. 14 is a perspective view illustrating a dividing step in the device chip manufacturing method illustrated in FIG. 6.

FIG. 14 is a perspective view illustrating the dividing step ST5 of the device chip manufacturing method illustrated in FIG. 6. The dividing step ST5 is a step of dividing the laminated wafer 21 along the division lines 19 to form a plurality of device chips 1 including the respective devices 6.

In the first preferred embodiment, the dividing step ST5 is performed by using a cutting apparatus 60 illustrated in FIG. 14. The cutting apparatus 60 includes a chuck table (not illustrated) for holding the laminated wafer 21 under suction, imaging means (not illustrated) for imaging the front side 12 of the subject part 11 of the laminated wafer 21, and a cutting unit 61 having a cutting blade 62 for cutting the laminated wafer 21 along the division lines 19. In performing the dividing step ST5, a circular dicing tape 121 is previously attached at its central portion to the wafer 20 of the laminated wafer 21. A ring frame 120 is previously attached to a peripheral portion of the dicing tape 121. Thus, the laminated wafer 21 is supported through the dicing tape 121 to the ring frame 120 as illustrated in FIG. 14. Thereafter, the laminated wafer 21 is held on the chuck table under suction in the condition where the dicing tape 121 is in contact with an upper surface of the chuck table. Thereafter, the imaging means is operated to image the front side 12 of the subject part 11 of the laminated wafer 21, thereby detecting the division lines 19. Thereafter, alignment is performed in such a manner that the cutting blade 62 is aligned with a predetermined one of the division lines 19.

Thereafter, the cutting blade 62 is rotated and lowered to fully cut the laminated wafer 21 along the predetermined division line 19 as relatively moving the chuck table and the cutting blade 62. Thereafter, this cutting operation is similarly repeated along the other division lines 19 to thereby divide the laminated wafer 21 into the individual device chips 1. After thus dividing the laminated wafer 21 along all of the crossing division lines 19, the individual device chips 1 are sequentially picked up from the dicing tape 121 by using a known pickup apparatus.

As described above, the dividing step ST5 in the first preferred embodiment is performed by using the cutting apparatus 60 to divide the laminated wafer 21 into the individual device chips 1. As a modification, the division of the laminated wafer 21 may be performed by any other methods. For example, ablation may be performed in such a manner that a laser beam having an absorption wavelength to the subject part 11 and the wafer 20 is applied along the division lines 19 to thereby divide the laminated wafer 21 into the individual device chips 1. As another method, stealth dicing may be performed in such a manner that a laser beam having a transmission wavelength to the subject part 11 and the wafer 20 is applied along the division lines 19 to thereby form a modified layer inside the laminated wafer 21 along each division line 19, and an external force is next applied to the laminated wafer 21 to thereby divide the laminated wafer 21 along each modified layer. As another method, plasma dicing may be performed in such a manner that the division lines 19 of the laminated wafer 21 are processed by plasma etching to thereby divide the laminated wafer 21 into the individual device chips 1.

As described above, the device chip manufacturing method according to the first preferred embodiment includes the attaching step of attaching the wafer 20 to the SiC ingot 10, the separating step of separating the SiC ingot 10 into the subject part 11 and a remaining part of the SiC ingot 10, the subject part 11 being attached to the wafer 20 to form the laminated wafer 21, the device forming step of forming the devices 6 on the front side 12 of the subject part 11 of the laminated wafer 21, and the dividing step of dividing the laminated wafer 21 along the division lines 19 to thereby manufacture the individual device chips 1.

According to this device chip manufacturing method, the thickness of the subject part 11 to be separated from the SiC ingot 10 can be reduced because the wafer 20 is attached to the SiC ingot 10 before separating the subject part 11 from the SiC ingot 10. That is, the subject part 11 is attached to the wafer 20 to form the laminated wafer 21, so that a sufficient mechanical strength can be ensured. Accordingly, in flattening the front side 12 of the subject part 11 of the laminated wafer 21, the amount of grinding of the front side 12 can be suppressed. That is, it is unnecessary to reduce the thickness of the laminated wafer 21, so that the manufacturing process can be simplified and the amount of the SiC ingot 10 to be discarded can be reduced.

As mentioned above, the amount of grinding of the front side 12 of the subject part 11 separated from the SiC ingot 10 can be suppressed in flattening the front side 12. Furthermore, in the dividing step ST5, the thin subject part 11 attached to the wafer 20 is cut along the division lines 19, so that the amount of processing of SiC can be suppressed and the time required for the processing can therefore be reduced. Accordingly, an increase in manufacturing cost for the device chips 1 can be suppressed.

Second Preferred Embodiment

Figure 15:
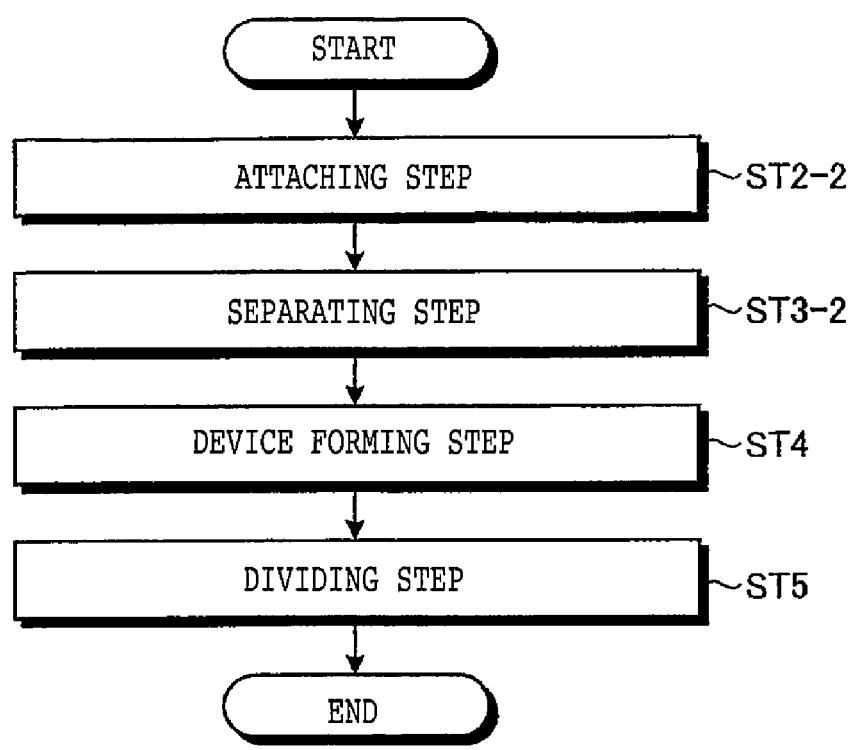
FIG. 15 is a flowchart illustrating the flow of a device chip manufacturing method according to a second preferred embodiment of the present invention.
Figure 16:
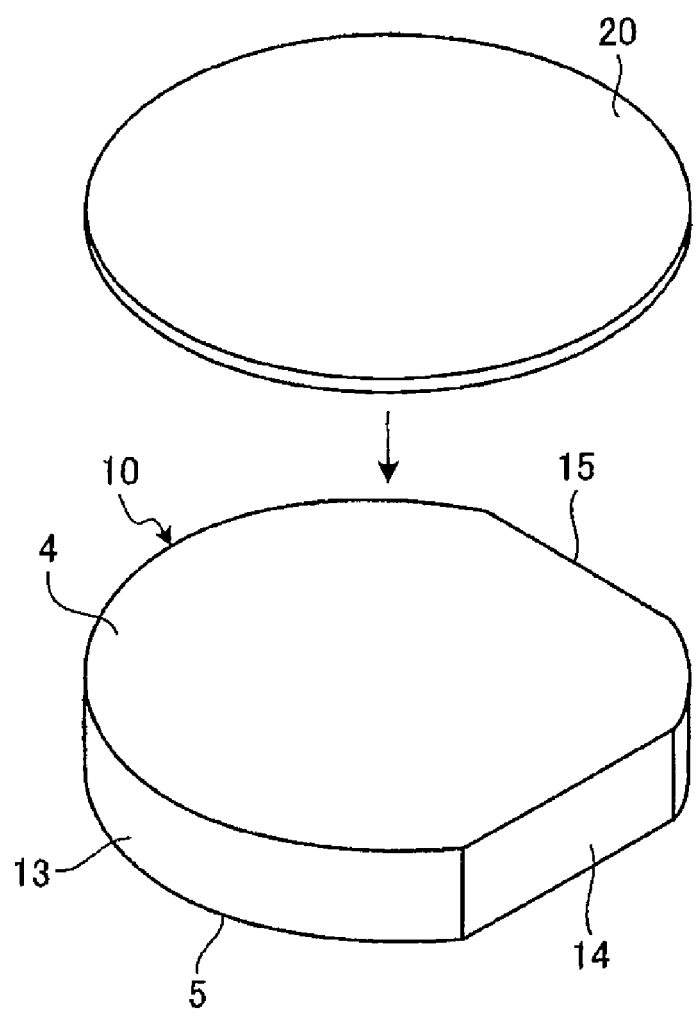
FIG. 16 is a perspective view illustrating an attaching step in the device chip manufacturing method illustrated in FIG. 15.
Figure 17:
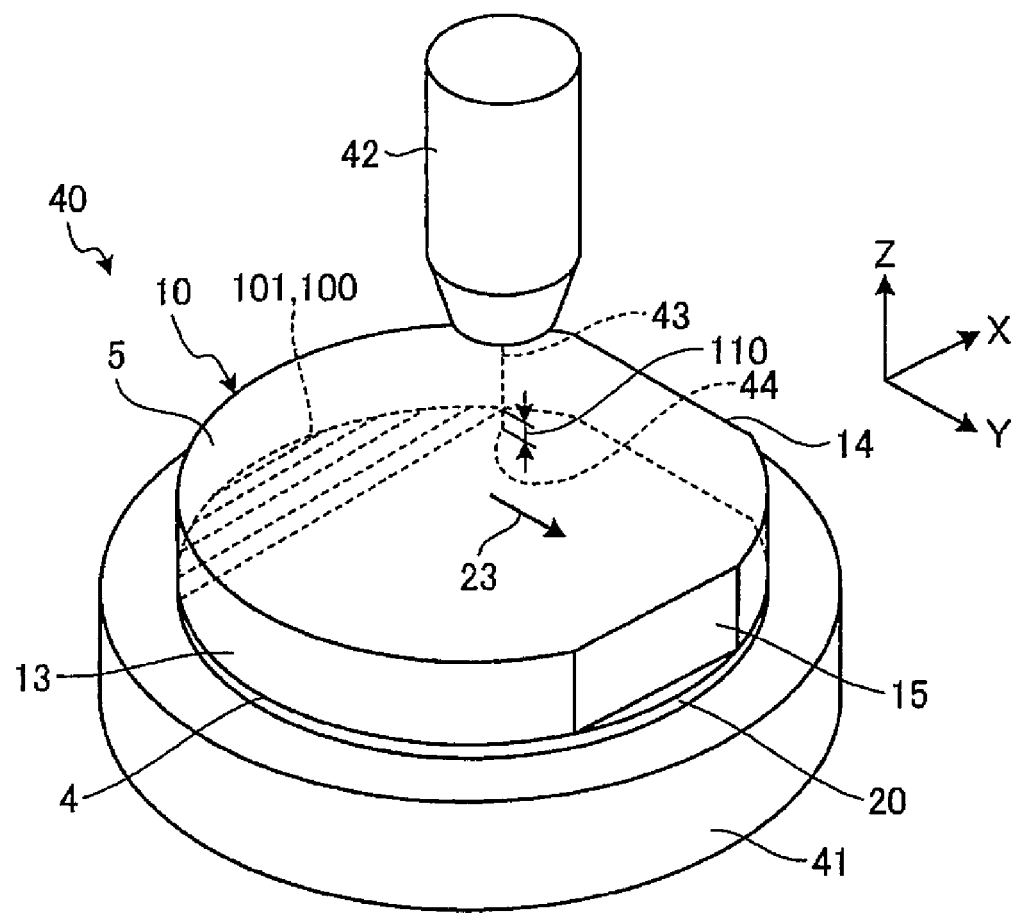
FIG. 17 is a perspective view illustrating a separating step in the device chip manufacturing method illustrated in FIG. 15.

A device chip manufacturing method according to a second preferred embodiment of the present invention will now be described with reference to the drawings. FIG. 15 is a flowchart illustrating the flow of the device chip manufacturing method according to the second preferred embodiment. FIG. 16 is a perspective view illustrating an attaching step included in the device chip manufacturing method illustrated in FIG. 15. FIG. 17 is a perspective view illustrating a manner of forming a separation layer in a separating step included in the device chip manufacturing method illustrated in FIG. 15. In FIGS. 15, 16, and 17, the same parts as those in the first preferred embodiment are denoted by the same reference numerals, and the description thereof will be omitted.

As illustrated in FIG. 15, the device chip manufacturing method according to the second preferred embodiment includes an attaching step ST2-2, a separating step ST3-2, a device forming step ST4, and a dividing step ST5. The second preferred embodiment is different from the first preferred embodiment only in that the attaching step ST2-2 and the separating step ST3-2 are different from the attaching step ST2 and the separating step ST3 in the first preferred embodiment and that the laser beam applying step ST1 is not included.

As illustrated in FIG. 16, the attaching step ST2-2 of the device chip manufacturing method according to the second preferred embodiment is a step of attaching a wafer 20 to the first surface 4 of an SiC ingot 10 as similar to the first preferred embodiment. However, in the second preferred embodiment, a separation layer 100 (see FIG. 17) has not yet been formed in the SiC ingot 10 in the attaching step ST2-2 as illustrated in FIG. 16. The wafer 20 is attached to the first surface 4 of the SiC ingot 10 not including the separation layer 100 by using a method similar to that in the first preferred embodiment. After finishing the attaching step ST2-2, the device chip manufacturing method proceeds to the separating step ST3-2.

As illustrated in FIG. 17, the separating step ST3-2 of the device chip manufacturing method according to the second preferred embodiment includes a first step of setting the focal point 44 of the laser beam 43 having a transmission wavelength to the SiC ingot 10 at a predetermined depth from the second surface 5 of the SiC ingot 10, this predetermined depth corresponding to the difference between the thickness of the SiC ingot 10 and the distance 110 from the first surface 4 of the SiC ingot 10, and next applying the laser beam 43 to the second surface 5 of the SiC ingot 10 to thereby form a separation layer 100 inside the SiC ingot 10. The separating step ST3-2 further includes a second step of applying an external force to the separation layer 100 formed inside the SiC ingot 10 to thereby separate the SiC ingot 10 into a subject part 11 and a remaining part of the SiC ingot 10, the subject part 11 being attached to the wafer 20 to form a laminated wafer 21.

More specifically, the first step of the separating step ST3-2 is performed by using a laser processing apparatus 40 similar to that illustrated in FIG. 7. The SiC ingot 10 attached to the wafer 20 is held on the chuck table 41 in the condition where the wafer 20 is in contact with the upper surface of the chuck table 41. That is, the second surface 5 of the SiC ingot 10 held on the chuck table 41 is oriented upward. Thereafter, the imaging means is operated to image the SiC ingot 10. According to an image obtained by the imaging means, the second orientation flat 15 is made parallel to the X direction and the direction 23 of inclination of the c-axis 17 is made parallel to the Y direction. Further, a relative positional relation between the laser beam applying unit 42 and the SiC ingot 10 in a horizontal direction is adjusted.

Thereafter, the focal point 44 of the laser beam 43 to be applied from the laser beam applying unit 42 is set inside the SiC ingot 10 at a predetermined depth from the second surface 5 of the SiC ingot 10, this predetermined depth corresponding to the difference between the thickness of the SiC ingot 10 and the distance 110 from the first surface 4 of the SiC ingot 10 as illustrated in FIG. 17. Thereafter, the pulsed laser beam 43 having a transmission wavelength to the SiC ingot 10 is applied from the laser beam applying unit 42 to the second surface 5 of the SiC ingot 10 as relatively moving the chuck table 41 and the laser beam applying unit 42 in the X direction at a predetermined feed speed.

Thereafter, as similar to the laser beam applying step ST1 in the first preferred embodiment, the laser processing operation and the indexing operation are repeated to form the separation layer 100 reduced in strength. That is, in the laser processing operation, the chuck table 41 and the laser beam applying unit 42 are relatively moved in the X direction as applying the laser beam 43 to the SiC ingot 10. In the indexing operation, the chuck table 41 and the laser beam applying unit 42 are relatively moved in the Y direction. Thus, the separation layer 100 is formed inside the SiC ingot 10 at the distance 110 from the first surface 4 of the SiC ingot 10, the separation layer 100 including plural modified portions 101 and plural cracks 102 (see FIG. 8). In each modified portion 101, SiC has been decomposed into Si and C.

After performing the first step of the separating step ST3-2 to thereby form the separation layer 100 inside the SiC ingot 10, the second step of the separating step ST3-2 is performed in a manner similar to that of the separating step ST3 in the first preferred embodiment. That is, an external force (ultrasonic vibration) is applied to the separation layer 100 formed inside the SiC ingot 10 to thereby break the separation layer 100, so that the SiC ingot 10 is separated along the separation layer 100 to obtain a subject part 11 and a remaining part of the SiC ingot 10, the subject part 11 being attached to the wafer 20 to form a laminated wafer 21 (see FIG. 11). After finishing the separating step ST3-2, the device chip manufacturing method proceeds to the device forming step ST4.

As described above, the device chip manufacturing method according to the second preferred embodiment includes the attaching step of attaching the wafer 20 to the SiC ingot 10, the separating step of separating the SiC ingot 10 into the subject part 11 and a remaining part of the SiC ingot 10, the subject part 11 being attached to the wafer 20 to form the laminated wafer 21, the device forming step of forming the devices 6 on the front side 12 of the subject part 11 of the laminated wafer 21, and the dividing step of dividing the laminated wafer 21 along the division lines 19 to thereby manufacture the individual device chips 1.

According to this device chip manufacturing method, the thickness of the subject part 11 to be separated from the SiC ingot 10 can be reduced because the wafer 20 is attached to the SiC ingot 10 before separating the subject part 11 from the SiC ingot 10. That is, the subject part 11 is attached to the wafer 20 to form the laminated wafer 21, so that a sufficient mechanical strength can be ensured. Accordingly, the manufacturing process can be simplified and the amount of the SiC ingot 10 to be discarded can be reduced. Further, the amount of processing of SiC can be suppressed and the time required for the processing can therefore be reduced. Accordingly, as similar to the first preferred embodiment, an increase in manufacturing cost for the device chips 1 can be suppressed.

[First Modification]

Figure 18:
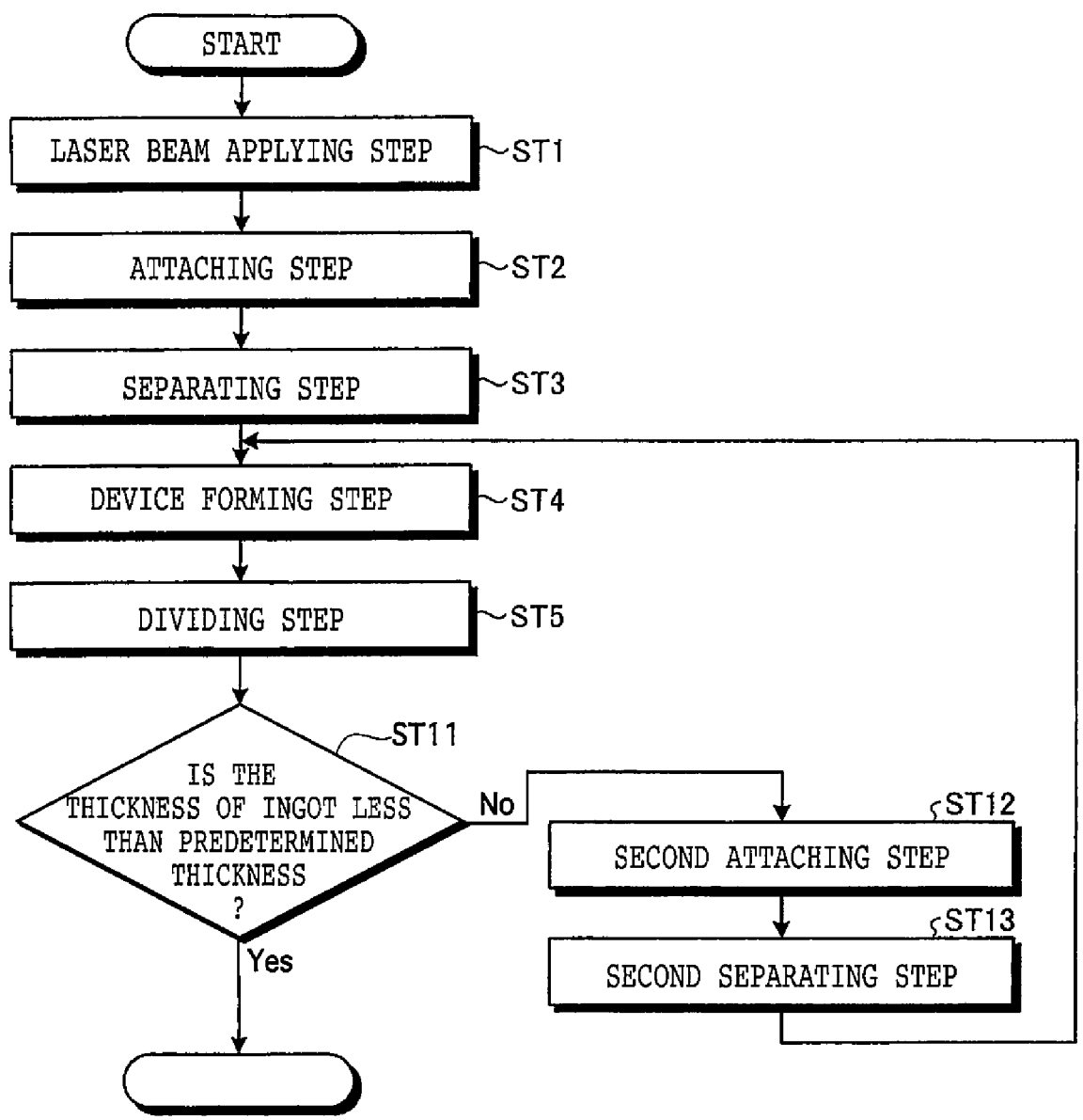
FIG. 18 is a flowchart illustrating the flow of a device chip manufacturing method according to a first modification of the first preferred embodiment.
Figure 19:
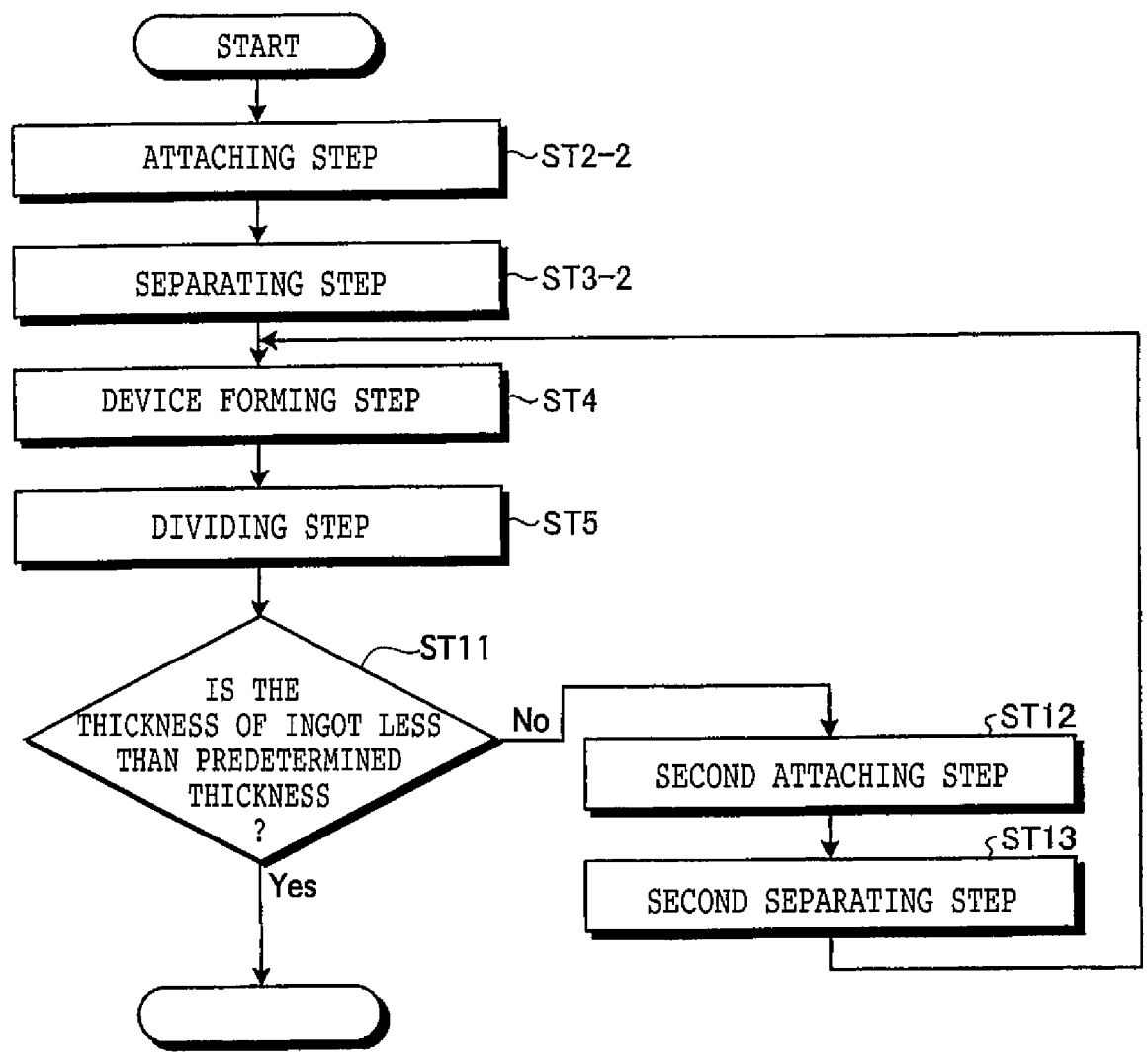
FIG. 19 is a flowchart similar to FIG. 18, illustrating a modification of the second preferred embodiment.

A device chip manufacturing method according to a first modification of the first or second preferred embodiment will now be described with reference to FIGS. 18 and 19. FIG. 18 is a flowchart illustrating the flow of the device chip manufacturing method according to the first modification of the first preferred embodiment. FIG. 19 is a flowchart illustrating the flow of the device chip manufacturing method according to the first modification of the second preferred embodiment. In FIGS. 18 and 19, the same parts as those in the first and second preferred embodiments are denoted by the same reference numerals, and the description thereof will be omitted.

As illustrated in FIGS. 18 and 19, the first modification is applied to the first and second preferred embodiments, in which a decision step ST11, second attaching step ST12, and second separating step ST13 are added to the dividing step ST5. The decision step ST11 is a step of determining whether the thickness of the remaining SiC ingot 10 left after performing the dividing step ST5 is less than a predetermined thickness. If the thickness of the remaining SiC ingot 10 is not less than the predetermined thickness (step ST11: No), the method proceeds to the second attaching step ST12 and the second separating step ST13. Thereafter, the method returns to the device forming step ST4. The other configuration is similar to that in the first and second preferred embodiments. In the first modification, the predetermined thickness in the decision step ST11 is equal to the thickness of the subject part 11 of the SiC ingot 10.

The second attaching step ST12 is a step of attaching a second wafer 20 to the first surface 4 of the remaining SiC ingot 10 after performing the dividing step ST5, i.e., after performing the separating step ST3. In the second attaching step ST12, the second wafer 20 is attached to the first surface 4 of the remaining SiC ingot 10 in a manner similar to that of the attaching step ST2-2 in the second preferred embodiment. Thereafter, the method proceeds to the second separating step ST13. As a modification, the first surface 4 of the remaining SiC ingot 10 may be ground and polished to become a mirror surface before performing the second attaching step ST12.

The second separating step ST13 is a step of separating the remaining SiC ingot 10 into a second subject part 11 and a new remaining part of the SiC ingot 10, in which the second subject part 11 is attached to the second wafer 20 to form a second laminated wafer 21. In the second separating step ST13, the remaining SiC ingot 10 is separated into the second subject part 11 and the new remaining part in a manner similar to that of the separating step ST3-2 in the second preferred embodiment. Thereafter, the method returns to the device forming step ST4.

If the thickness of the remaining SiC ingot 10 is less than the predetermined thickness (step ST11: Yes), the method is ended.

Thus, in the device chip manufacturing method according to the first modification, the SiC ingot 10 is repeatedly separated to obtain a plurality of subject parts 11 until the thickness of the remaining SiC ingot 10 becomes less than the predetermined thickness, each subject part 11 being attached to the wafer 20 to form the laminated wafer 21. Then, each laminated wafer 21 obtained is divided into the individual device chips 1.

As described above, the device chip manufacturing method according to the first modification includes the attaching step of attaching the wafer 20 to the SiC ingot 10, the separating step of separating the SiC ingot 10 into the subject part 11 and a remaining part of the SiC ingot 10, the subject part 11 being attached to the wafer 20 to form the laminated wafer 21, the device forming step of forming the devices 6 on the front side 12 of the subject part 11 of the laminated wafer 21, and the dividing step of dividing the laminated wafer 21 along the division lines 19 to thereby manufacture the individual device chips 1. As a result, an increase in manufacturing cost for the device chips 1 can be suppressed as similar to the first and second preferred embodiments.

In addition, the SiC ingot 10 is repeatedly separated to obtain a plurality of subject parts 11 until the thickness of the remaining SiC ingot 10 becomes less than the predetermined thickness, each subject part 11 being attached to the wafer 20 to form the laminated wafer 21. Then, each laminated wafer 21 obtained is divided into the individual device chips 1. Accordingly, the amount of the SiC ingot 10 to be discarded can be suppressed.

[Second Modification]

Figure 20:
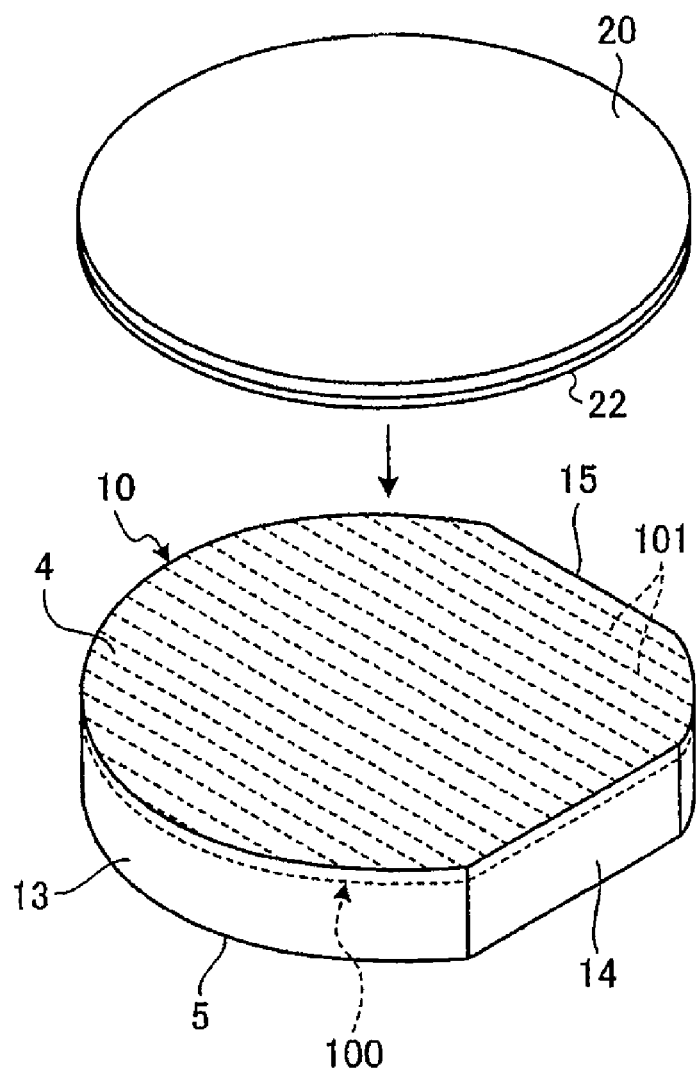
FIG. 20 is a perspective view illustrating an attaching step in a device chip manufacturing method according to a second modification of the first preferred embodiment.

A device chip manufacturing method according to a second modification of the first preferred embodiment will now be described with reference to FIG. 20. FIG. 20 is a perspective view illustrating an attaching step in the device chip manufacturing method according to the second modification. In FIG. 20, the same parts as those in the first preferred embodiment are denoted by the same reference numerals, and the description thereof will be omitted.

In the attaching step ST2 according to the second modification, an insulating layer 22 is formed on a lower surface of the wafer 20 as illustrated in FIG. 20, and the wafer 20 is bonded through the insulating layer 22 to the first surface 4 of the SiC ingot 10 by diffusion bonding or plasma-assisted low-temperature bonding. For example, the insulating layer 22 is formed of $SiO_2$. However, the material of the insulating layer 22 is not limited to $SiO_2$ in the present invention. Further, while the insulating layer 22 is formed on the lower surface of the wafer 20 in this modification, the insulating layer 22 may be formed on the first surface 4 of the SiC ingot 10. That is, the insulating layer 22 is formed either on the lower surface of the wafer 20 or on the first surface 4 of the SiC ingot 10 in the present invention.

The device chip manufacturing method according to the second modification includes the attaching step of attaching the wafer 20 to the SiC ingot 10, the separating step of separating the SiC ingot 10 into the subject part 11 and a remaining part of the SiC ingot 10, the subject part 11 being attached to the wafer 20 to form the laminated wafer 21, the device forming step of forming the devices 6 on the front side 12 of the subject part 11 of the laminated wafer 21, and the dividing step of dividing the laminated wafer 21 along the division lines 19 to thereby manufacture the individual device chips 1. As a result, an increase in manufacturing cost for the device chips 1 can be suppressed as similar to the first preferred embodiment.

In recent years, a device chip having a so-called SOI (Silicon On Insulator) structure has been developed and manufactured. Such a device chip having a SOI structure is manufactured by bonding two wafers through an insulating layer and next thinning one of the two wafers bonded together. In contrast to this conventional manufacturing method, the device chip manufacturing method according to the second modification includes the step of bonding the wafer 20 and the SiC ingot 10 through the insulating layer 22, so that the device chip 1 having a SOI structure incorporating the buried insulating layer 22 can be easily manufactured.

While the device chip manufacturing method according to the second modification is applied to the attaching step ST2 in the first preferred embodiment, the second modification may be similarly applied to the attaching step ST2-2 in the second preferred embodiment. That is, the insulating layer 22 may be formed either on the lower surface of the wafer 20 on the first surface 4 of the SiC ingot 10 (see FIG. 16). Thereafter, the wafer 20 may be bonded through the insulating layer 22 to the SiC ingot 10 by diffusion bonding or plasma-assisted low-temperature bonding.

[Third Modification]

Figure 21:
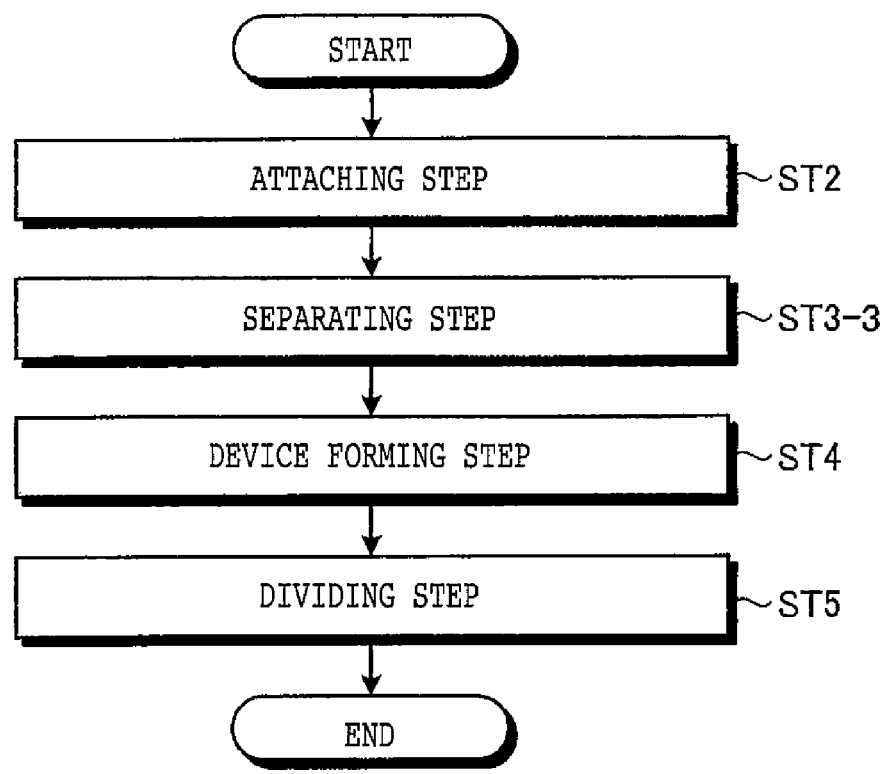
FIG. 21 is a flowchart illustrating the flow of a device chip manufacturing method according to a third modification of the first preferred embodiment.

A device chip manufacturing method according to a third modification of the first preferred embodiment will now be described with reference to FIG. 21. FIG. 21 is a flowchart illustrating the flow of the device chip manufacturing method according to the third modification. In FIG. 21, the same parts as those in the first preferred embodiment are denoted by the same reference numerals, and the description thereof will be omitted.

The device chip manufacturing method according to the third modification is different from the first preferred embodiment in that the laser beam applying step ST1 illustrated in FIG. 6 is not performed and that a separating step ST3-3 is performed by using a wire saw capable of performing electrical discharge machining. That is, in the separating step ST3-3, the SiC ingot 10 is separated into the subject part 11 and a remaining part of the SiC ingot 10 by using the wire saw. The other configuration is similar to that in the first preferred embodiment.

The device chip manufacturing method according to the third modification includes the attaching step of attaching the wafer 20 to the SiC ingot 10, the separating step of separating the SiC ingot 10 into the subject part 11 and a remaining part of the SiC ingot 10, the subject part 11 being attached to the wafer 20 to form the laminated wafer 21, the device forming step of forming the devices 6 on the front side 12 of the subject part 11 of the laminated wafer 21, and the dividing step of dividing the laminated wafer 21 along the division lines 19 to thereby manufacture the individual device chips 1. As a result, an increase in manufacturing cost for the device chips 1 can be suppressed as similar to the first preferred embodiment.

While the device chip manufacturing method according to the third modification is applied to the first preferred embodiment, the third modification may be similarly applied to the second preferred embodiment. That is, the separating step ST3-3 may be performed to separate the SiC ingot 10 by using a wire saw.

Further, while the SiC ingot 10 is used as a semiconductor ingot in the above preferred embodiments, the semiconductor ingot is not limited to the SiC ingot 10 in the present invention. For example, a hexagonal single-crystal ingot or a silicon ingot may be used as the semiconductor ingot in the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device chip manufacturing method for manufacturing a plurality of device chips from a semiconductor ingot having a first surface and a second surface opposite to the first surface, the device chip manufacturing method comprising:
    an attaching step of attaching a wafer to the first surface of the semiconductor ingot;
    a separating step of separating the semiconductor ingot into a subject part and a remaining part after performing the attaching step, the subject part being attached to the wafer to form a laminated wafer having a front side as an exposed surface of the subject part and a back side as an exposed surface of the wafer;
    a device forming step of setting a plurality of crossing division lines on the front side of the laminated wafer to thereby define a plurality of separate regions after performing the separating step, and next forming a plurality of devices in the respective separate regions; and
    a dividing step of dividing the laminated wafer along the division lines after performing the device forming step, thereby forming the plurality of device chips including the respective devices.

2. The device chip manufacturing method according to claim 1, wherein the separating step includes:
    a first step of setting a focal point of a laser beam having a transmission wavelength to the semiconductor ingot inside the semiconductor ingot at a predetermined depth from the second surface of the semiconductor ingot and next applying the laser beam to the second surface of the semiconductor ingot to thereby form a separation layer inside the semiconductor ingot at the predetermined depth, and
    a second step of applying an external force to the separation layer to thereby separate the semiconductor ingot into the subject part and the remaining part.

3. The device chip manufacturing method according to claim 1, further comprising:
    a laser beam applying step of setting a focal point of a laser beam having a transmission wavelength to the semiconductor ingot inside the semiconductor ingot at a predetermined depth from the first surface of the semiconductor ingot before performing the attaching step, and next applying the laser beam to the first surface of the semiconductor ingot to thereby form a separation layer inside the semiconductor ingot at the predetermined depth;
    the separating step including a step of applying an external force to the separation layer to thereby separate the semiconductor ingot into the subject part and the remaining part.

4. The device chip manufacturing method according to claim 1, further comprising:
    a second attaching step of attaching a second wafer to the remaining part of the semiconductor ingot after performing the separating step; and
    a second separating step of separating the remaining part of the semiconductor ingot into a second subject part and a new remaining part after performing the second attaching step, the second subject part being attached to the second wafer to form a second laminated wafer.

5. The device chip manufacturing method according to claim 1, wherein the semiconductor ingot includes an SiC ingot.

6. The device chip manufacturing method according to claim 1, wherein the attaching step includes a step of bonding the wafer through an insulating layer to the semiconductor ingot.

7. The device chip manufacturing method according to claim 1, wherein each of the devices includes a MOSFET.

8. The device chip manufacturing method according to claim 1, wherein each of the devices includes a MEMS device.

9. The device chip manufacturing method according to claim 1, wherein the wafer is formed of a material that is different from the material of the ingot.

10. The device chip manufacturing method according to claim 9, wherein the wafer is formed of SiC.

11. The device chip manufacturing method according to claim 9, wherein the wafer is formed of SiC and the ingot is formed of silicon.

12. The device chip manufacturing method according to claim 9, wherein the ingot is formed of a hexagonal single-crystal material.

13. The device chip manufacturing method according to claim 1, wherein said attaching step comprises diffusion bonding.

14. The device chip manufacturing method according to claim 1, wherein the attaching step comprises plasma-assisted low-temperature bonding.

* * * * *